United States Patent
Simola

(10) Patent No.: US 7,335,838 B2
(45) Date of Patent: Feb. 26, 2008

(54) WALL ELEMENT FOR MAGNETICALLY SHIELDED ROOM AND MAGNETICALLY SHIELDED ROOM

(75) Inventor: Juha Simola, Helsinki (FI)

(73) Assignee: Elekta AB (PUBL), Stockholm (SE)

(*) Notice: Subject to any disclaimer, the term of this patent is extended or adjusted under 35 U.S.C. 154(b) by 437 days.

(21) Appl. No.: 10/500,546

(22) PCT Filed: Jan. 3, 2003

(86) PCT No.: PCT/FI03/00003

§ 371 (c)(1),
(2), (4) Date: Mar. 14, 2005

(87) PCT Pub. No.: WO03/059030

PCT Pub. Date: Jul. 17, 2003

(65) Prior Publication Data

US 2005/0162249 A1    Jul. 28, 2005

(30) Foreign Application Priority Data

Jan. 8, 2002    (FI) ................................. 20020025

(51) Int. Cl.
*H05K 9/00*    (2006.01)
(52) U.S. Cl. .................. 174/386; 174/384; 174/377; 174/391
(58) Field of Classification Search ............... 174/377, 174/384, 391, 386
See application file for complete search history.

(56) References Cited

U.S. PATENT DOCUMENTS

| 4,890,083 A | 12/1989 | Trenkler et al. |
| 5,210,373 A | 5/1993 | Weber |
| 5,786,547 A * | 7/1998 | Zielinski ............... 174/375 |

FOREIGN PATENT DOCUMENTS

| EP | 0 242 484 | 10/1987 |
| JP | 02-260500 | 10/1990 |
| JP | 08-167787 | 6/1996 |

* cited by examiner

*Primary Examiner*—Hung V. Ngo
(74) *Attorney, Agent, or Firm*—Merchant & Gould P.C.

(57) ABSTRACT

The invention relates to a wall element for a magnetically shielded room and to a magnetically shielded room. The wall element comprises at least one first layer (1) which is formed of metal plate having a high electrical conductivity, and at least two layers, a second layer (2) and a third layer (3), which consist of metal plates having a high magnetic permeability. The layers (1, 2, 3) are superimposed one on top of another in surface contact with each other without any separating air gaps, so that each first layer (1) having a high electrical conductivity lies between each second (2) and third layers (3) having a high permeability substantially in surface contact with the second and third layers, the layers together forming a compact structure in which the product ($\sigma \times \mu$) of electrical conductivity ($\sigma$) and permeability ($\mu$) is maximized so as to minimize the penetration depth of magnetic interference.

36 Claims, 4 Drawing Sheets

WALL ELEMENT FOR MAGNETICALLY SHIELDED ROOM AND MAGNETICALLY SHIELDED ROOM

FIELD OF THE INVENTION

The present invention concerns a wall element as defined in the preamble of claim 1. Moreover, the invention concerns a magnetically shielded room as defined in the preamble of claim 16.

The present invention relates to shielding of sensitive devices against magnetic interference occurring in their environment. Examples of devices requiring electromagnetic shielding specifically against magnetic fields are ultrasensitive measuring devices like SQUID-based magnetometers used in biomagnetism, or electron beam lithography devices used for making patterns on nano-scale thin films in semiconductor industry. These devices are typically operated in urban areas close to sources of strong magnetic interference such as trains and cars—which cause interference predominantly in the low frequency domain below one Herz—and digital electronic equipment and computers emitting radiation at higher frequencies up to the megaherz range.

DESCRIPTION OF PRIOR ART

The easiest way to achieve magnetic shielding is to construct a coil system—three orthogonal Helmholz coils, say—around the space to be shielded. The currents fed to the coils to compensate magnetic interference are controlled by signals from a magnetometer with e.g. a three axis flux meter. The magnetometer can be placed either outside the coil system, if the interfering field is known to be predominantly uniform, or inside the coil system close to the instrument to be shielded.

These techniques are examples of active shielding. The major advantages of active shielding are low cost and low weight. The efficiency of active shielding is, however, limited by the performance of the control system. The finite number of coils used for compensation are able to generate compensating fields of certain geometric shapes only. Therefore, an interference field of complicated geometry over a large volume can be only partially compensated. Even if this geometric performance of the system were sufficient, the degree of active compensation is always limited by the intrinsic noise level and operation band of the flux meters producing the difference signal.

Because of these limitations the active shielding is often supplemented or even replaced with passive magnetic shields, which are typically made of materials having either a high magnetic permeability or a good electrical conductivity. A high-permeability material shields the surrounding space by getting strongly magnetized, which leads to the appearance of an induced field counterbalancing the magnetizing interference field in the vicinity of the magnetized material. Effectively this corresponds to "focusing" of the magnetic flux from the environment into the material itself.

The shielding provided by a good conductor is based on a rather different mechanism. Owing to the good conductivity, strong eddy currents are provoked in a conductor exposed to a varying magnetic field. The magnetic field associated with these induced currents counteracts the interfering magnetic field. The conductivity being finite leads to damping of the induced currents so that this mechanism contributes to shielding only at higher frequencies and is totally ineffective in the case of a static field.

An example of a passive shield is a Magnetically Shielded Room (MSR), which is commonly used in biomagnetic measurements. Tens of such rooms of different size and construction have been built during the last forty years. There are rooms made of thick plates of plain aluminum ("Thick-walled conducting shield in biomagnetic experiments", J. A. V. Malmivuo, P. Heinonen, M. Tuomola, and J. Lekkala, in *Biomagnetism*, eds S. N. Erne & al. 1981, WdG, Berlin, pp. 107-112), as well as rooms made almost exclusively out of high-permeability Ni/Fe-alloys ("The 8-layered magnetically shielded room of the PTB: Design and construction", J. Bork, H.-D. Hahlbohm, R. Klein, and A. Schnabel, $12^{th}$ International Conference on Biomagnetism, Helsinki, 2000). Most commercially available rooms consist of several nested shells made of either aluminum or Ni/Fe plates, or Ni/Fe plates on aluminum.

These rooms are used in practically every laboratory or hospital making biomagnetic recordings of the human central nervous system or the human heart because, as compared to active compensation arrangements, a properly constructed magnetically shielded room is a simple straightforward method of magnetic shielding for the large volumes necessary for these applications.

A simple way to characterize the performance of a magnetically shielded room quantitatively is to define a frequency dependent shielding factor, $S(f)=B_o(f)/B_i(f)$, where $B_o$ is the density of magnetic flux outside the magnetically shielded room and $B_i$ is the flux density inside the room, for example at the center. The shielding factor defined in this way is a dimensionless scalar quantity and its numerical value may also be given in decibels: S in dB=20*Log(S).

The frequency spectrum of the magnetic interference $B_o(f)$ in a typical urban environment follows the 1/f rule in the range 0.1 to 100 Hz, which is relevant for biomagnetic applications. Therefore, the highest shielding factor would be needed at a low frequency below one Herz.

Since eddy current shielding is ineffective at low frequencies, a conductive wall material has no significance in this most important frequency range. Thus, to guarantee a sufficient shielding performance, prior-art solutions are mainly focused on optimizing ferromagnetic shielding.

It has been shown by calculations and demonstrated experimentally (for example "Design, Construction, and Performance of a Large-Volume Magnetic Shield", V. O. Kelhä, J. M. Pukki, R. S. Peltonen, A. J. Penttinen, R. J. Ilmoniemi, and J. J. Heino, IEEE Trans on Magnetics, Mag-18, no. 1, 1982, and references therein) that, with a given fixed amount of ferromagnetic material having a given magnetic permeability, the best way to maximize the low frequency shielding factor is to divide the ferromagnetic material into successive nested shells so that the volume of the outer shell is clearly larger than the volume of the next inner shell. The inner shell being much smaller and basically exposed to the field at the center of the outer shell, a total shielding factor $S_t$ is obtained that is close to the product of the shielding factors of the individual shells.

If the second shell were simply placed on top of the first one, the total shielding factor would be the sum of the two shielding factors only. Typically, for a single ferromagnetic shell of reasonable thickness S=10, so that a sufficient gap between the two shells leads to the shielding factor $S_t \approx 10*10=100$, whereas using the same amount of material in a single wall of double thickness only gives $S_t \approx 10+10=20$.

This way of thinking has led to very large and heavy magnetically shielded room designs, especially because in a biomagnetic application the space requirement inside the innermost shell is already about 3*4*2.5 m³. The total wall thickness of a three-shell magnetically shielded room having two sufficiently wide gaps between shells may well be about 50 cm. Such a multi-shell magnetically shielded room may weigh about ten tons and can only be installed in a two-floor space because it has a height of 3.5 m. It is expensive and requires, a complicated door construction; a slow-to-operate multiple door arrangement may be necessary when more than two shells are used. These are the principal disadvantages of prior-art solutions.

Magnetic shielding using metal shells is based on two different physical phenomena:
1) magnetization of magnetically polarizing material, and
2) eddy currents induced by a varying magnetic field.

Mechanism 1) requires that the shell material have a magnetic polarizability greater than that of a vacuum (the relative permeability must be higher than unity, preferably as high as possible), but the material need not be electrically conductive. In mechanism 2), the material must be electrically conductive. Mechanism 1) is independent of the frequency of the interference signal (up to a certain limit frequency, above which it has no effect), whereas shielding based on mechanism 2) is ineffective at low frequencies but grows better as the frequency of the magnetic field increases.

This application discloses a method according to the invention whereby a magnetic shielding shell can be produced from a given amount of µ-metal and aluminum sheets so that eddy current shielding based on mechanism 2) is maximized. Thus, the aim in the structure of the invention is that the eddy current shielding effect should start from a frequency as low as possible and increase as steeply as possible with the frequency.

Eddy current shielding achieved using a metallic shielding shell is based on eddy currents of two types of geometric distribution: a) "global" eddy currents revolving around the shielding shell along its walls, and b) local eddy currents inside the wall.

The shielding factors associated with eddy current types a) and b) have different degrees of frequency dependency. Eddy currents (a) revolving around the entire shielding shell produce a shielding effect starting from a certain limit frequency $f_1$, and as the frequency increases, the shielding factor associated with them increases in direct proportion to the frequency, $S \sim f$. The limit frequency $f_1$ is determined by the ratio of the electrical resistance of the shielding shell to the inductance, which is determined by the size of the room ($f_1$ is inversely proportional to the conductivity $\sigma$ of the shell). Local eddy currents (b) involve another threshold frequency $f_2$, which again is determined by the thickness of the wall material and the so-called penetration depth, $\delta=1/\sqrt{\pi\sigma\mu f}$. Here, $\sigma$ is conductivity of wall material and $\mu$ is magnetic permeability. Above frequency $f_2$, where the penetration depth is smaller than the wall thickness d, the eddy current shielding associated with this mechanism increases exponentially, $S \sim \exp(d/\delta)$, i.e. very steeply.

These qualitative aspects, and especially the differences between the two eddy current mechanisms are clearly demonstrated in FIG. 1, which shows the shielding factors S(f) calculated for spherical shielding shells, one of which is a shell of 12 mm thick aluminum and the other a shell of 2 mm thick µ-metal (µ-metal consisting of a Ni/Fe alloy is also referred to as Mumetal, trademark of Vacuumschmelze GmBH)(the two lowermost curves). For the aluminum shell of said thickness, $f_1 \sim 1$ Hz and $f_2 \sim 50$ Hz, whereas for the 2-mm µ-metal shell $f_1 \sim 120$ Hz and $f_2 \sim 2.5$ Hz. As compared to the aluminum shell, the limit frequency $f_1$ for the µ-metal shell is higher because it has a resistance over a hundred times that of the aluminum shell and a lower $f_2$ value because its $\sigma\mu d^2$ is higher by a factor of 20. For the aluminum shell, since $f_1 \ll f_2$, the shielding factor exhibits only a slow increase of a mainly linear nature owing to the shielding currents revolving around the shell when the frequency is higher than the threshold frequency $f_1 \sim 1$ Hz. For the µ-metal wall, the inverse is true; $f_1 \gg f_2$, and the increase in the shielding factor is of a much steeper exponential type in the range immediately above the threshold frequency $f_2 \sim 2.5$ Hz, where the penetration depth of magnetic interference is smaller than the 2-mm wall thickness. The shielding effect of global eddy currents in µ-metal is negligible.

Since the shielding factor S associated with each of the two eddy current mechanisms increases as a function of frequency, it is obvious that, to increase the shielding factor S at a given fixed frequency, it is sufficient to find a wall structure for which the threshold frequency values, either $f_1$ or $f_2$, are as small as possible. Increasing the wall thickness would of course be a brute-force method of reducing the threshold frequencies, but it would lead to expensive and heavy structures.

In prior art, specification U.S. Pat. No. 5,210,373 discloses a self-supporting sandwich panel designed for use as a wall structure in a magnetically shielded room. The panel consists of a core part made of load-bearing material and at least one layer of magnetizable material fixed to the core part. This specification is mainly focused on the mechanical structure of the shielded room, based on load-bearing structures eliminating the need for a separate supporting framework structure. The specification describes a sandwich structure in which shielding layers are attached to either side of the core part of the panel, and it emphasizes that this procedure yields a rigid self-supporting panel structure. A structure is also described in which a layer of conductive metal is mounted between the shielding layer and the core part. However, being separated by the load-bearing core part, the shielding layers on opposite sides of it are at a distance from each other, which means that the structure substantially corresponds to the prior-art nested shielding shells described above, in which the metal layers are not in surface contact with each other but separated by an air gap. The structure corresponds to an arrangement where the shielding layers constituting nested shell layers are now only attached to opposite sides of the core part of the panel as the supporting structure used earlier as a mount for the shells has been left out. The specification makes no reference to the combined effect of the eddy current and magnetization mechanisms of the wall elements, nor is their combined effect brought about in the way proposed in the present invention, to be described hereinafter in detail.

Specification U.S. Pat. No. 4,890,083 concerns a wall structure consisting of sheets made of several ferromagnetic materials having different magnetic properties, the sheets being placed in surface contact with each other. The aim is to optimize the structure so that each µ-metal type should have ideal magnetic properties in the particular operating conditions (magnetic field) to which the wall made of the respective µ-metal will be subjected in the wall. However, the specification makes no reference to any sort of alternate surface-to-surface assembly of highly conductive sheets and µ-metal sheets. It states that copper sheets placed on the outer surfaces of the pack of sheets are only needed if the wall must provide shielding against high-frequency interference as well. The specification does not disclose the interaction between alternate permeable and conductive material layers that leads to an apparent high product ($\sigma \times \mu$) of electrical conductivity ($\sigma$) and permeability ($\mu$) and to a minimized penetration depth, which is the essential idea behind the present application.

SUMMARY OF THE INVENTION

The wall element of the invention for a magnetically shielded room is characterized by what is presented in claim 1. Further, the magnetically shielded room of the invention is characterized by what is presented in claim 16.

The wall element of the invention comprises:
- at least one first layer made of metal sheet having a high electrical conductivity,
- at least two layers, a second layer and a third layer, consisting of metal sheets having a high magnetic permeability.

According to the invention, the layers are mounted in an alternating order one upon the other in surface contact with each other without any separating air gaps, so that each first layer having a high electrical conductivity lies between each second and third layers having a high permeability substantially in surface contact with the second and third layers, said layers together forming a compact structure in which the product ($\sigma \times \mu$) of electrical conductivity ($\sigma$) and permeability ($\mu$) is maximized so as to minimize the penetration depth of magnetic interference.

Correspondingly, the magnetically shielded room of the invention comprises walls, a floor and a ceiling consisting of wall elements adjacently attached to each other to form a shell structure, each one of said wall elements comprising:
- at least one first layer made of metal sheet having a high electrical conductivity,
- at least two layers, a second layer and a third layer, which are metal sheets having a high magnetic permeability.

According to the invention, the layers are mounted in an alternating order one upon the other in surface contact with each other without any separating air gaps, so that each first layer having a high electrical conductivity lies between each second and third layers having a high permeability substantially in surface contact with the second and third layers, said layers together forming a compact structure in which the product ($\sigma \times \mu$) of electrical conductivity ($\sigma$) and permeability ($\mu$) is maximized so as to minimize the penetration depth of magnetic interference.

Other features and preferred embodiments are presented in the subclaims.

The invention relates to an optimal method for technically integrating two types of magnetic shielding and materials—soft ferromagnetic materials and highly conductive eddy current materials—into a compact wall element having a maximal shielding efficiency.

The invention is motivated by the need to reduce the size, weight, complexity, and cost of magnetic shielding, especially a magnetically shielded room. Therefore, the composite wall element described is intended to be used in single-shell shielding room constructions, but it is also an optimal element in the individual shells of a multi-shell magnetic shield.

As the increase of the shielding factor associated with local eddy currents (mechanism b mentioned above) is considerably steeper (exponential) above the threshold frequency $f_2$, the most advantageous way of increasing the shielding factor is to produce a wall structure such that specifically a $f_2$ value as low as possible will be achieved. According to the invention, this is achieved by minimizing the penetration depth of magnetic interference, i.e. by maximizing the product $\sigma \times \mu$.

The wall structure of the invention has both a maximal permeability and a maximal electrical conductivity. In the equations describing the magnetic shielding, the conductivity of the shielding shell is only used as a factor multiplying the frequency f. This means that when the conductivity of the shell is increased e.g. by a factor of 100, eddy current shielding corresponding to a given frequency $f_0$ will be already achieved at a frequency of $f_0/100$.

This is clearly demonstrated in FIG. 1, which shows a calculated shielding factor S(f) for both a 2 mm thick $\mu$-metal shell and a similar fictive shell having the permeability of $\mu$-metal but also the conductivity of aluminum (the uppermost S(f) curve). It can be seen that, using a highly magnetizable and highly conductive material like this, it would be possible to achieve in the 1 . . . 100 Hz frequency range, which is important e.g. for cerebral measurements, a shielding effect about 100 . . . 1000 times better than that obtained using $\mu$-metal.

There is no steel ("$\mu$-aluminum") that has such a good electrical conductivity. The central insight of the invention is that a wall material resembling highly conductive steel can be technically implemented by arranging thin $\mu$-metal and aluminum sheets alternately one on top of the other to form a layered structure (a "sandwich" or "plymetal" structure) and by using an appropriate joining technique to ensure the uniformity of adjacent layers of the wall elements around the entire magnetic shield.

The fact that a sandwich structure of $\mu$-metal and aluminum yields a shielding effect substantially corresponding to that of fictive "$\mu$-aluminum" is demonstrated in FIG. 1. It shows an S(f) curve calculated for an eight-layer structure ($\mu$/Al/$\mu$/Al/$\mu$/Al/$\mu$/Al) and lying very close to the S(f) curve calculated for "$\mu$-aluminum". When a still more finely structured $\mu$/Al sandwich element is constructed (more than eight layers), the S(f) curve will further approach that of "$\mu$-aluminum", and when a more coarse-structured sandwich element (e.g. $\mu$/Al/$\mu$/Al) is constructed, e.g. like that represented by the third curve from above in FIG. 1, the corresponding S(f) curve will be further distanced from the S(f) curve for "$\mu$-aluminum".

Of course, the electrical properties of the $\mu$/Al sandwich are not in every respect equivalent to those of fictive, highly conductive and homogenous $\mu$-metal, because the electrical conductivity and magnetic properties of the sandwich are anisotropic: the electrical conductivity only equals that of aluminum in the plane of the sandwich (not in a perpendicular direction). It is essential for the invention that this anisotropicity does not at all impair the properties of the sandwich in respect of its magnetic shielding effect as compared to a homogeneous material. This is so because the eddy currents mainly flow in the plane of the shell and not perpendicularly to it. As regards "global" eddy currents, this is obvious, but local eddy currents in fact also consist of currents flowing in the plane of the shell, only the intensity and even the direction of these currents being different at different depths inside the plate (i.e. in different aluminum layers of the sandwich). For the eddy currents to become substantially as effective in respect of magnetic shielding as in highly conductive "$\mu$-aluminum", good conductivity is not required in a direction perpendicular to the shell but only in a direction tangential to it.

The reasoning behind the invention has been derived from model calculations, the results of which are shown in FIG. 1. These calculations of the shielding factor S(f) of different wall compositions have been made by the Shielding Matrix method ("Magnetic shielding factors of a system of concentric spherical shells", J. Appl. Phys. 33, no 3, 1967). The method is based on an analytic solution of Maxwell's equations for concentric spherical shells made of materials having a given electrical conductivity and relative permeability and exposed to a uniform external magnetic field. The fact that magnetic shields and magnetically shielded rooms typically have the shape of a rectangular polyhedron rather than a sphere has been taken into account by modifying the demagnetization factors in the shielding matrix method in a way commonly used in the literature (see for example Kelhä & al.).

Aluminum and μ-metal are used in these calculations as examples of conductive and ferromagnetic materials with relative permeability values of 1 and 16000 and conductivity values of $3.57*10^7$ and $1.82*10^6$ $(\Omega m)^{-1}$, respectively. The size of the magnetically shielded room is $3*4*2.4$ $m^3$, and the shield is assumed to have a $5*5$ $cm^2$ hole for feedthroughs. The field leaking through this hole limits the shielding factor of the best wall structures to the level of about 114 dB in FIG. 1.

In the calculated examples in FIG. 1, the amount of expensive and heavy μ-metal is limited to a total thickness of 2 mm and the combined weight of the wall elements to below 3000 kg, which allows the use of a total thickness of 12 mm of aluminum in the wall. In all the cases shown in FIG. 1, the successive layers of μ-metal and aluminum are assumed to be in contact with each other. This corresponds to the central idea of the present invention; to find an optimal integral wall element or module that can be prefabricated in factory before final assembly into a lightweight magnetically shielded room at the installation site.

The two lowermost curves in FIG. 1 show S(f) for the rooms with walls made of plain aluminum (12 mm) and plain μ-metal (2 mm). As pointed out above, the shielding efficiency of plain aluminum is negligible at low frequencies. The eddy current shielding starts to show up between 0.1 and 1 Hz and increases steadily toward higher frequencies.

The S for the plain 2 mm μ-metal wall is 21 dB at low frequencies. This shielding effect results entirely from the focusing of the magnetic flux into the wall. The focusing of flux does not increase with increasing frequency; the phenomenon eventually decreases beyond about one kilohertz because of the decreasing dynamic permeability. The rise of S with frequency in the plain μ-metal wall is entirely due to the eddy current effects which start to show up at frequencies above 10 Hz. This enhancement of shielding only becomes observable at frequencies ten times higher than in the case of aluminum because μ-metal has a conductivity lower than that of aluminum by a factor of twenty.

From about 20 Hz on up, the increase of S is clearly steeper for μ-metal than for aluminum. This exponential increase is due to the interaction between the flux-focusing and eddy-current mechanisms: the focusing boosts the eddy current damping by enhancing the alternating flux density of the magnetic field in the metal. In plain aluminum, no focusing occurs.

As seen from FIG. 1, the rise of S with increasing frequency in the high-permeability material is extremely steep above 100 Hz; S increases by more than a factor of 100 when the frequency rises from 100 to 300 Hz. A steep rise like this could be brought about at lower frequencies by increasing the conductivity of the high-permeability material. This is clear from the formulas of the Shielding Matrix Model, where conductivity appears only as a factor multiplying the frequency. The uppermost curve in FIG. 1 shows the shielding factor that is obtained with a 2 mm wall of fictitious "μ-aluminum" having the permeability of μ-metal but a conductivity corresponding to the combination of 2 mm of μ-metal and 12 mm of aluminum.

"μ-aluminum" does not exist but its function can be mimicked by using a technically feasible wall structure, a sandwich structure according to the invention, consisting of interleaved and alternate sheets of high-permeability material and highly conductive material. This is the central innovation in this invention. The shielding factors obtained for the three μ/Al sandwich structures (FIG. 1) indicate that the enhanced eddy current damping of the AC magnetic field, intensified because of flux focusing, considerably improves the shielding at frequencies above 0.1 Hz. The ferromagnetic material in the wall element is divided into several separate layers placed around or in between the plates made of highly conducting wall material.

The interaction between the two shielding mechanisms is already obvious from the third S(f)-curve in FIG. 1, describing a composite wall having 2 mm of μ-metal inside and 12 mm of aluminum outside: The shielding factor of this wall structure exceeds the product of the shielding factors of 2 mm of plain μ-metal and 12 mm of plain aluminum at all frequencies above 0.03 Hz. Here the enhancement of shielding owing to the interaction between the two mechanisms is maximal around 4 Hz, where it reaches 9 dB (factor 2.8).

This kind of a bilayer composite wall has been used by some room makers. Aluminum has been considered to be necessary for rf-shielding anyway, and aluminum plates have provided handy means of supporting thin 1 mm μ-metal sheets. This structure can be considered as part of prior art.

As is seen from FIG. 1, already by simply dividing the 2 mm of μ-metal in this prior-art wall structure into two 1-mm sheets placed on opposite sides of the 12-mm aluminum plate enhances magnetic shielding by more than 10 dB in the range of 0.2 . . . 10 Hz. Distributing the same total amount of ferromagnetic material even more uniformly among the conducting material—as in the μ/Al-composite structures μ/Al/μ/Al in FIG. 1 with layer thicknesses of 1 mm/6 mm/1 mm/6 mm respectively and μ/Al/μ/Al/μ/Al/μ/Al with layer thicknesses of 0.5 mm/3 mm/0.5 mm/3 mm/0.5 mm/3 mm/0.5 mm/3 mm respectively—leads to a further enhancement of shielding at frequencies above 0.5 Hz.

Dividing the ferromagnetic material into thinner and thinner plates distributed evenly among the aluminum would raise the shielding factor toward the uppermost "μ-aluminum" curve in FIG. 1. This indicates that a sandwich structure made of alternate high-permeability and high-conductivity plates really mimics "μ-aluminum"; it functions like a highly conductive ferromagnetic shielding material.

The large gaps between the shells of different shielding material—characteristic to prior-art multi-shell electromagnetically shielded rooms—do improve shielding in the case of a static magnetic field, but they do not have a significant effect on the interaction between the two shielding mechanisms at higher frequencies. This is seen by comparing the shielding factors for the 1/6/1/6 mm sandwich structure and a similar but thicker wall, where the successive four layers are separated from each other by 17 cm. The latter design leads to a prior-art type room having outer dimensions larger by one meter in all three directions. In the case of a static field, where the eddy current shielding mechanism is absent, the latter design has a shielding factor about 5 dB higher than that of the sandwich structure, but above 0.5 Hz the shielding provided by the sandwich structure actually exceeds that of the thicker wall by 2 dB. Obviously due to the closer contact between the ferromagnetic and conductive layers, the sandwich wall shows a stronger "µ-aluminum" effect that boosts shielding above 0.5 Hz.

This indicates that it is always advantageous to mix ferromagnetic and conductive materials in the shells of a shielding room, even in multi-shell shielding room designs. This idea is new compared to prior art, where separate aluminum shells are included among the µ-metal shells, primarily because aluminum—being an excellent conductor compared to µ-metal—provides good shielding against rf interference. The 26 ton room constructed at PTB in Berlin (Bork & al.) includes among its eight shells only one aluminum shell, which is separate from the seven other shells made of plain µ-metal. This design may be optimal at the lowest frequencies, where aluminum is irrelevant, but at higher frequencies a compromise with some of the µ-metal replaced with interleaved aluminum plates would provide better shielding.

To compensate for the loss of shielding efficiency at low frequencies when instead of a multi-shell room a single-shell sandwich wall is used, active compensation may be applied. Working with a narrow bandwidth below about 10 Hz, the internal noise level of the sensor giving the difference signal and the phase shifts associated with the surrounding conducting material are not a problem, and a reasonable degree of interference suppression is achievable with an active compensation coil arrangement, the cost of which is a fraction of what one or two extra shells of a magnetic shielding room would cost.

All the calculated results referred to above are valid for ideal closed nested shells only. The overall geometry of the shielding shells is crucial for both the flux-focusing and the eddy-current mechanisms; only a closed ferromagnetic shell geometry is free of any edges of the shield that would affect the flux focusing, and the "global" eddy currents around the conductive shells are essential in the eddy-current shielding mechanism.

This fact has two consequences from the point of view of design and construction of magnetic shields. First, the shielding efficiency of a given wall structure cannot be found out by making calculations, or experiments, with a simple plane geometry; the shielding factor calculations can only be verified by comparing shielding factor measurements made on closed shields, either small scale models or existing rooms. Second, in the actual design of the shield the ferromagnetic and electric continuity of each layer must be guaranteed.

The technical realizations of the shielding layers in prior-art magnetically shielded rooms as well as in the present invention consist of ferromagnetic and conductive elements with non-ideal joints between them. These joints represent extra resistance and magnetic reluctance in the shells, which must be taken into account as reduced effective values of permeability and conductivity in the shielding matrix model calculations.

A comparison of the shielding factors calculated by the shielding matrix method with the measured S(f) of several prior art rooms shows that—with the techniques available at present—properly designed and realized joints between wall elements effectively reduce the conductivity of the aluminum shells by less than 20%, and the effective dynamic permeability values of the ferromagnetic plates are reduced from the 20000 . . . 30000 range given by the raw-material suppliers down to a range of values between about 15000 . . . 23000.

To keep the effective permeability as high as this, a low enough magnetic reluctance in the joints between the ferromagnetic elements is required. For this purpose, the desirable overlap area between adjacent elements must be as wide as possible. The requirement is fulfilled in the ferromagnetic shells of prior-art rooms by stacking two or more layers of thin µ-metal sheets on top of each other so that the joints of the first layer are overlapped by the sheets of the next layer. In some designs, crossing layers of µ-metal sheets on top of each other have been used (for example Kelhä & al.). These methods of ensuring a low magnetic reluctance naturally lead to the asymmetric prior-art µ/Al wall structure referred to above (see FIG. 1), but they are not congruent with the sandwich-type wall element concept of the present invention.

To reach a sufficiently low magnetic reluctance with the element construction of the present invention, a double-sided joint structure like that shown in FIG. 5 is necessary. The joint between adjacent ferromagnetic sheets must comprise an overlap area several centimeters wide. The plates to be joined must be pressed together so that the gap between them in the overlap area is minimized.

To achieve a good continuity of the conductive shells, the aluminum layers of adjacent elements must have overlapping contacts at least a few centimeters wide and possibly provided with some kind of conductive paste or EMI gaskets. In some prior art rooms, an ideal electrical continuity has been achieved by welding the aluminum elements so as to form an integral shell (Kelhä & al.). This method can not be used in the case of sandwich-type wall elements.

An example of a wall element according to the present invention is shown in FIG. 2. The elements are identical, except for their length; a few longer ones are needed for the roof and the floor if the width of the room is greater than its height. A room assembled from such integral wall elements, especially if it comprises only one shell, can be quickly installed and disassembled and moved to another location when needed.

The preassembly of these elements at the factory can be automated. This minimizes the handling of the separate thin ferromagnetic plates and prevents the reduction of their permeability, which would result from harsh mechanical handling. In the finished element, the aluminum plate between two ferromagnetic ones extends further out and protects them during further handling and assembly of the magnetically shielded room.

BRIEF DESCRIPTION OF THE DRAWINGS

FIG. 1 presents examples of calculated shielding factors S(f) for rooms having different wall structures consisting of layers of high-permeability and high-conductivity metal plates. The plain µ, plain Al and the two-layer µ/Al wall structures are represent prior art. The µ/Al/µ, µ/Al/µ/Al and µ/Al/µ/Al/µ/Al/µ/Al/µ/Al structures, all composed of the same total amount of µ-metal and aluminum per square meter of wall, are embodiments of the present invention. The total thickness of µ-metal and aluminum in all the composite µ/Al wall structures are 2 and 12 mm, respectively. The uppermost "µ-aluminum" curve has been calculated for a wall made of fictitious material having the permeability of µ-metal and a total conductivity corresponding to 12 mm of aluminum. This curve is the asymptote that is approached but never reached when the µ-metal and aluminum in the composite wall are divided into finer and finer interleaved sheets.

DETAILED DESCRIPTION OF THE PREFERRED EMBODIMENTS

Figure 1:
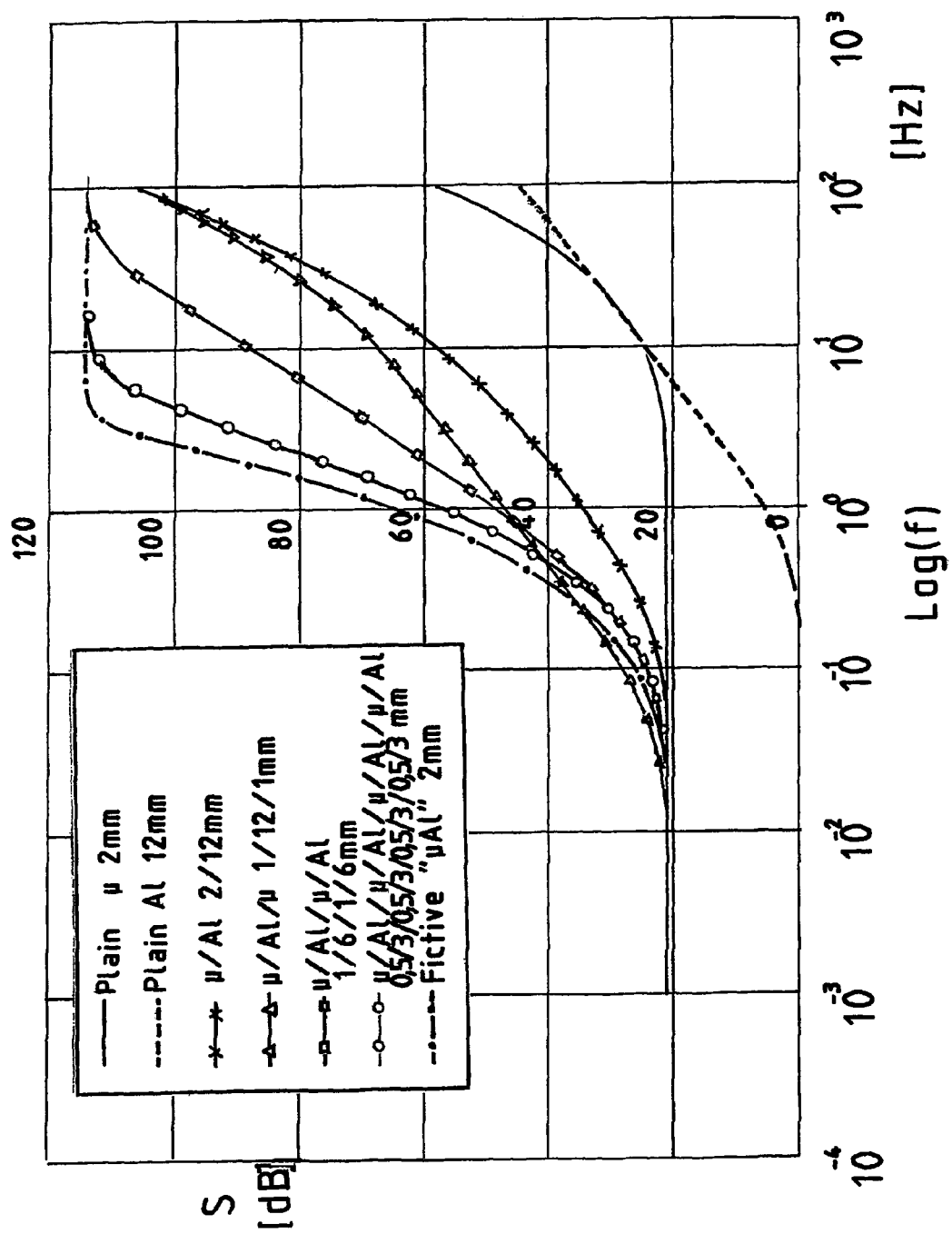
FIG. 1 represents the shielding factor S(f) as a function of frequency f, the frequency f being presented on the horizontal axis on a logarithmic scale.

The composite magnetic shield according to the present invention works as indicated in FIG. 1 only if the magnetic and electric continuity is taken care of in each wall of the sandwich structure and in each one of its subshells. Assembling the wall elements from a very large number of separate sheets is laborious, and the thickness tolerances tend to prevent achieving the required electric and magnetic contact in the joints between the elements. For this reason, the extreme sandwich structure—made up of a very large number of thin metal sheets, and having the best shielding properties—is rather impractical.

Figure 2:
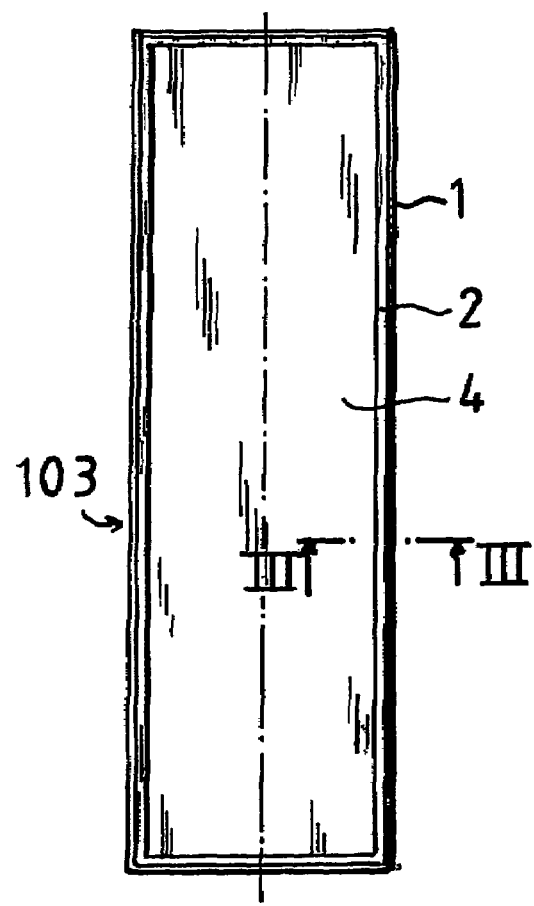
FIG. 2 presents an embodiment of the wall element of the invention in planar view.
Figure 3:
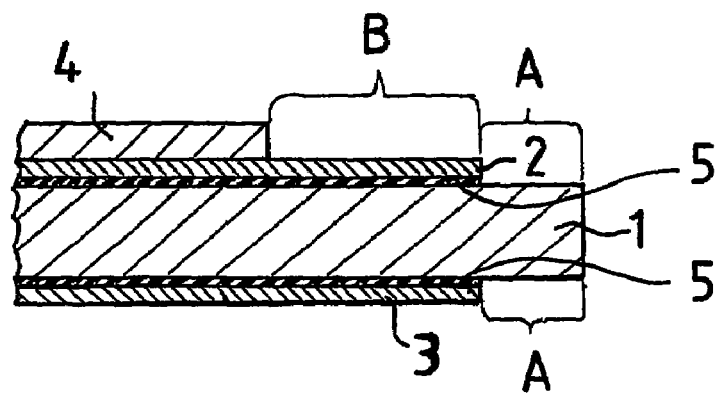
FIG. 3 presents a magnified section III-III of FIG. 2.

Therefore, a simple four layer element as presented in FIGS. 2 and 3 is described by way of example as a preferred embodiment.

Referring to FIGS. 2 and 3, the wall element 103 consists of four rectangular metal plates mounted face-to-face by gluing or mechanically. The element comprises a first layer 1, which is a sheet of highly conductive metal, e.g. aluminum (Al). Further, the element comprises two layers, a second layer 2 and a third layer 3, which are metal plates having a high magnetic permeability, in this example µ-metal plates. In addition, the element has a fourth layer 4, which is a metal plate, e.g. of aluminum (Al), having a high electrical conductivity. When a magnetically shielded room as presented in FIG. 4 is assembled from the elements, the plate forming the fourth layer 4 remains on the outside of the room.

The plates 1, 2, 3, 4 are mounted in an alternating order face-to-face one on top of another without any separating air gaps so that the first layer 1 having a high electrical conductivity lies between each second 2 and third layer 3 substantially in surface contact with the second and third layers, said layers together forming a compact structure in which the product ($\sigma \times \mu$) of electrical conductivity ($\sigma$) and permeability ($\mu$) is maximized so as to minimize the penetration depth of magnetic interference.

The plates 1, 2, 3, 4 are cut to dimensions such that, when stacked concentrically, all the edges of the element have the structure shown in FIG. 2. The aluminum plate 1 in the middle position reaches out from between the ferromagnetic µ-metal plates 2 and 3. This protects the ferromagnetic plates 2 and 3 during the handling of the elements. The exposed aluminum surface A at the edge of the aluminum plate 1 also serves as an electrical contact with the cover strip 6, see FIG. 5. The outer ferromagnetic µ-metal plate 2 is further covered by the second aluminum plate 4, which leaves the edges of the µ-metal plate 2 in area B uncovered to allow ferromagnetic contact with the cover strip 6. To provide a proper fit between the edges of the wall element 103 and the cover strips 6, thin layers of soft dielectric material 5 may be inserted between the aluminum plate 1 and the µ-metal plate 2, 3.

Figure 4:
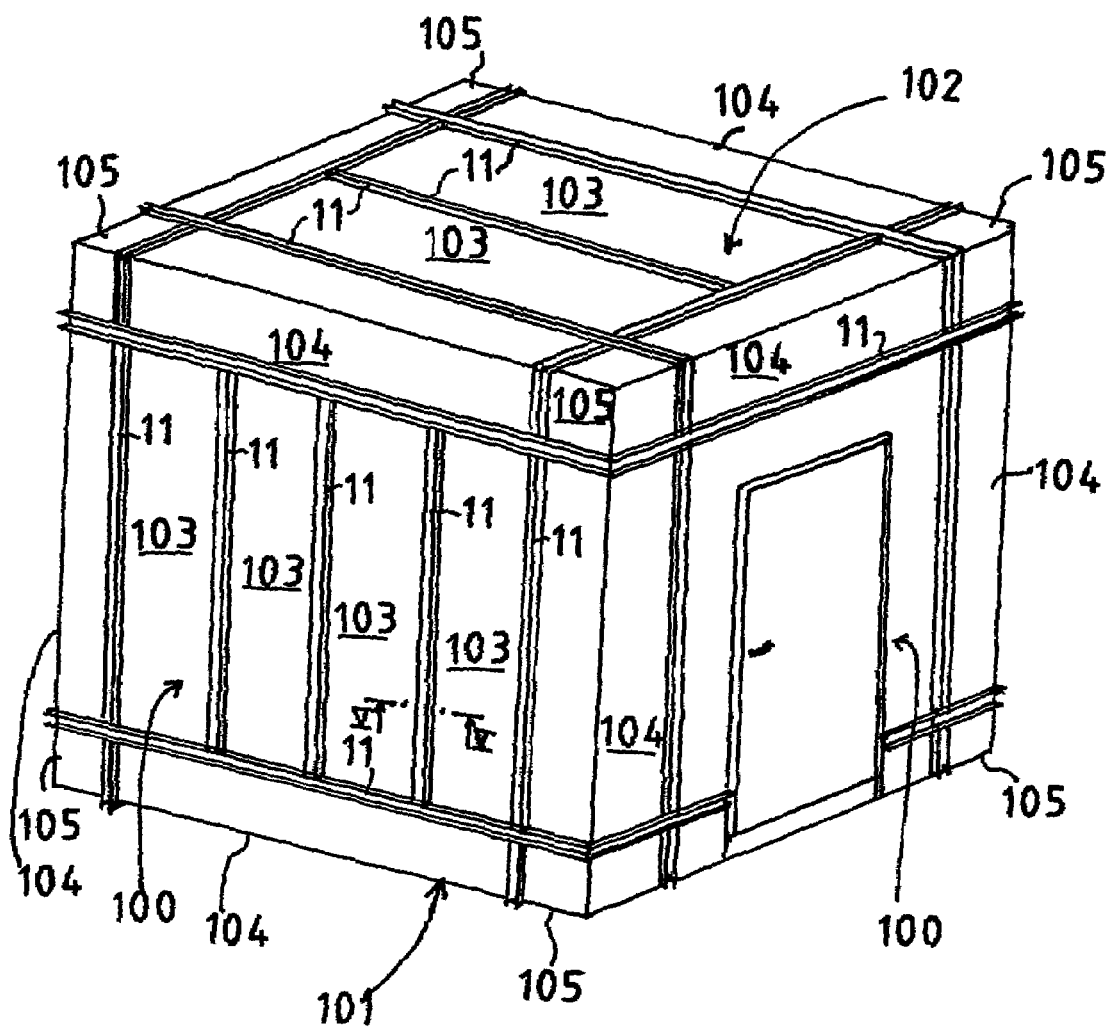
FIG. 4 is an axonometric diagrammatic representation of an embodiment of the magnetically shielded room of the invention.
Figure 5:
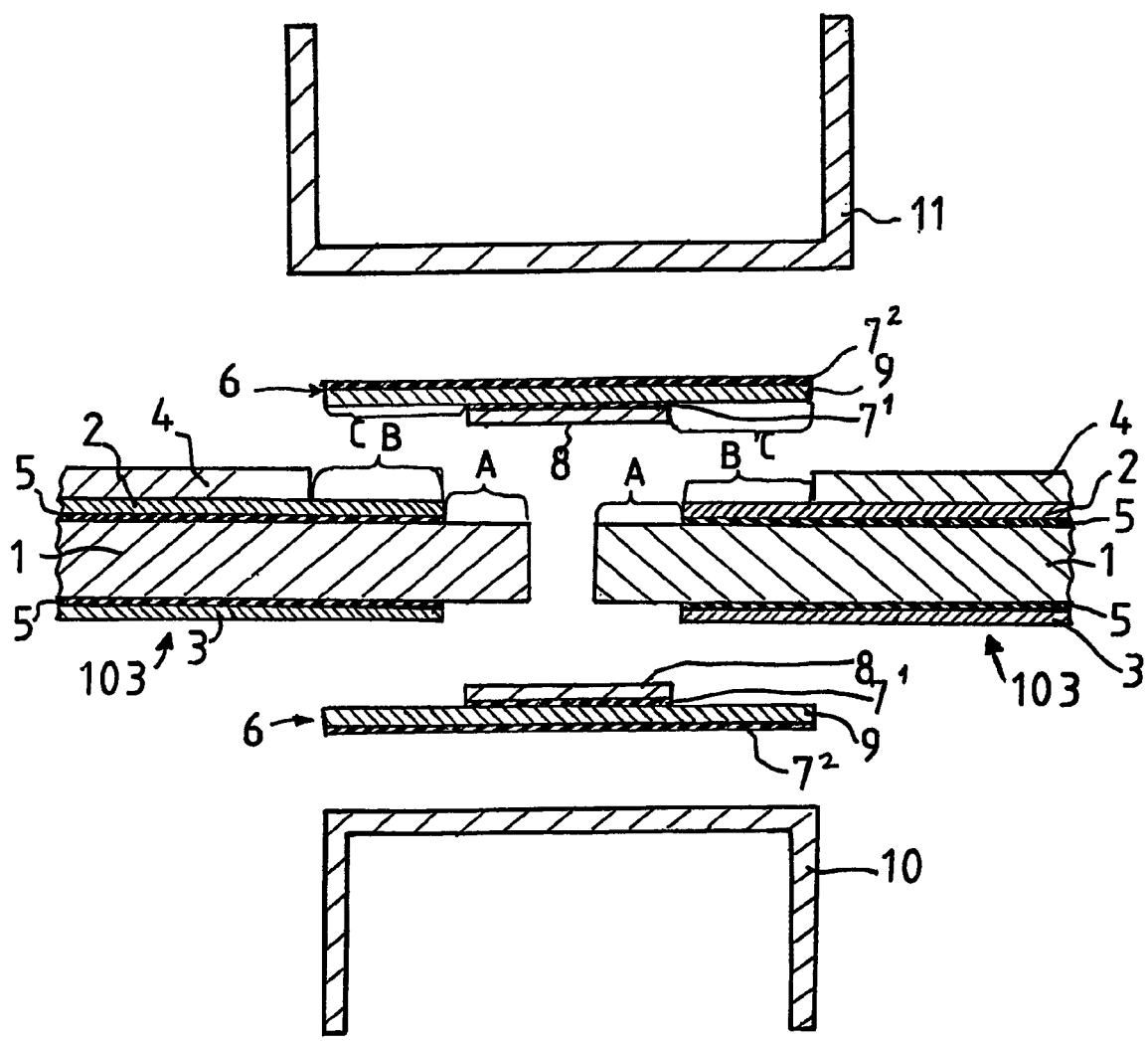
FIG. 5 presents an exploded view of a cross-section V-V of the joint between two wall elements as shown in FIG. 2, which is used to ensure layer-by-layer magnetic and electric continuity between the wall elements.

FIG. 4 presents a magnetically shielded room comprising walls 100, a floor 101 and a roof 102, which have been formed from wall elements 103, 104, 105 joined adjacently to each other by joints as presented in FIG. 5 to form a shell structure.

The wall-to-wall, wall-to-floor, and wall-to-ceiling corners of the room require special elements 104,105. The structure of these elements is identical with the ordinary wall elements 103 except that they may be narrower and are bent at an angle of 90° along their central line as shown with a dashed line in FIG. 2. The relatively thick aluminum components of such corner elements are preferably made from symmetric L-profiles, whereas the ferromagnetic and µ-metal plates needed are bent and then heat-treated after the bending.

FIG. 5 presents the means whereby two adjacent wall elements 103 are joined together so that continuous electric and magnetic conductivity between them is achieved. To form the joint, two cover strips 6 are used, which are placed on either side of the wall over the seam area between the two adjacent wall elements 103. These cover strips 6 may be identical, but not necessarily. The composite cover strip 6 consists of a narrow plate 8 made of highly conductive material, such as aluminum, and a layer 9 of ferromagnetic material having a high permeability, e.g. µ-metal. The µ-metal layer 9 is fastened onto the aluminum layer 8. The µ-metal layer 9 is wider than the aluminum layer 8 so that the µ-metal layer 8 thus has an exposed third area C beside the aluminum layer 8 on either side. When the cover strip 6 is placed so as to cover the seam area, the aluminum layer 8 is in contact with surfaces A of the aluminum layers 1 of the adjacent wall elements, thus providing electrical conductivity over the seam, and the surfaces of the µ-metal layer 9 of the cover strip 6 are in contact with the µ-metal layers 2, 3 of the adjacent wall elements, thus providing electrical conductivity over the seam.

The cover strip 6 may comprise two thin sheets $7^1$ and $7^2$ of elastic material. Layer $7^1$ is disposed between the aluminum layer 8 and the µ-metal layer 9. Layer $7^2$ is disposed on top of the µ-metal layer 9 on the opposite side with respect to the aluminum layer 8. These elastic layers function as springs to secure a good contact with the wall elements for both the aluminum layer and the ferromagnetic layer, regardless of the thickness tolerances of the plates involved. For mechanical protection, the cover strips 6 are mounted on the aluminum U-beams 10 and 11 before transportation and handling at the installation site. This may be done using small screws the heads of which fit in the gap between the two wall elements. The holes for these screws as well as the larger holes for the bolts used in the assembly of the room are made before heat treatment of the ferromagnetic strips. No holes are needed in the wall elements 103, 104, 105 except for the penetrations needed for ventilation of the room and technical feed-throughs required by the device in the room.

When the room is being assembled, the beams 11 on the outside also serve as a supporting frame. The wall elements are placed against these frame beams—which have pre-mounted cover strips 6 placed on them—and clamped in place by using the inside U-beams 10 with cover strips 6. The bolts used for clamping go through the pre-made holes in both beams 10 and 11 and through the cover strips 6 and the gap between the wall elements, which is slightly wider than the bolt diameter.

The electrical continuity of the outermost aluminum layer 4 may be taken care of by the beams 11 of the supporting frame, or by an additional aluminum strip placed on top of the cover strip in case the beams are made of low conductivity metal like steel.

To ensure the electrical continuity of the aluminum layers, EMI-gaskets may be used between the aluminum parts of the wall elements and the cover strips. The extra space needed for the gaskets is obtained by adjusting the thickness of the elastic layers 7.

The invention claimed is:

1. A wall element for a magnetically shielded room, said wall element comprising
at least one first layer which is formed of metal plate having a high electrical conductivity,
at least two layers, a second layer and a third layer, which are formed of metal plate having a high magnetic permeability, wherein said layers are superimposed one on top of another in surface contact with each other without any separating air gaps, so that each first layer having a high electrical conductivity lies between each second and third layers having a high permeability substantially in surface contact with the second and third layers, the layers together forming a compact structure in which the product ($\sigma \times \mu$) of electrical conductivity ($\sigma$) and permeability ($\mu$) is maximized so as to minimize the penetration depth of magnetic interference, and
a fourth layer, which is formed of a material having a high electric conductivity, said fourth layer being superimposed on top of the second layer to form an outside layer of the wall element.

2. Wall element according to claim 1, wherein the wall element is a corner element having a bend angle of 90°.

3. Wall element according to claim 1, wherein the first layer and/or the fourth layer is an integral aluminum sheet.

4. Wall element according to claim 1, wherein the second layer and/or the third layer is an integral $\mu$-metal sheet or formed of adjacent pieces of $\mu$-metal sheet.

5. Wall element according to claim 1, wherein the composite structure of the wall element comprises two or more sets of first, second and third layers, in which structure the layers having a high electrical conductivity and the layers having a high permeability are alternately interleaved.

6. Wall element according to claim 1, wherein the wall element comprises a fifth layer which consists of elastic material substantially thinner than the first and/or second layer and which is disposed between the first layer and the second layer and/or between the first layer and the third layer.

7. Wall element according to claim 1, wherein, at the edge area of the wall structure, each inner layer reaches further out than the outer layer placed on top of the inner layer to expose each inner layer for contact.

8. Wall element according to claim 1, wherein, at the edge area of the wall structure, the first layer is disposed to reach further out than the other layers so that a first surface on each opposite side of the first layer is exposed for contact.

9. Wall element according to claim 1, wherein, at the edge area of the wall structure, the second layer is disposed to reach further out toward the edge than the fourth layer so that a second surface of the second layer is exposed for contact.

10. Wall element according to claim 1, wherein the layers are secured to each other by gluing.

11. Wall element according to claim 1, wherein the layers are secured to each other by mechanical means.

12. Wall element according to claim 1, wherein the total thickness of aluminum in the wall element is of the order of about 12 mm.

13. Wall element according to claim 1, wherein the total thickness of $\mu$-metal in the wall element is of the order of about 2 mm.

14. Wall element according to claim 1, wherein the wall element has the shape of a planar rectangle.

15. A magnetically shielded room comprising walls, floor and a ceiling, which are formed of wall elements adjacently connected to each other to form a shell structure, said wall elements each comprising:
at least one first layer which is formed of metal plate having a high electrical conductivity,
at least two layers, a second layer and a third layer, which are formed of metal plate having a high magnetic permeability, wherein said layers are superimposed one on top of another in surface contact with each other without any separating air gaps, so that each first layer having a high electrical conductivity lies between each second and third layers having a high permeability substantially in surface contact with the second and third layers, the layers together forming a compact structure in which the product ($\sigma \times \mu$) of electrical conductivity ($\sigma$) and permeability ($\mu$) is maximized so as to minimize the penetration depth of magnetic interference, and
a fourth layer which is formed of a material having a high electrical conductivity and which fourth layer is superimposed on top of the second layer to form an outermost layer of the wall element.

16. Room according to claim 15 wherein the first layer and/or the fourth layer is an integral aluminum sheet.

17. Room according to claim 16, wherein the composite structure of the wall element comprises two or more sets of first, second and third layers, in which structure the layers having a high electrical conductivity and the layers of material having a high permeability are alternately interleaved.

18. Room according to claim 15, wherein the second layer and/or the third layer is an integral $\mu$-metal sheet or formed of adjacent pieces of $\mu$-metal sheet.

19. Room according to claim 15, wherein the wall element comprises a layer consisting of thin elastic material and disposed between the first layer and the second layer and/or between the first layer and the third layer.

20. Wall element according to claim 15, wherein, at the edge area of the wall structure, each inner layer reaches further out than the outer layer placed on top of the inner layer to expose said inner layer for contact.

21. Wall element according to claim 15, wherein, at the edge area of the wall structure, the first layer is disposed to reach further out than the other layers so that a first surface on each opposite side of the first layer is exposed for contact.

22. Wall element according to claim 15, wherein, at the edge area of the wall structure, the second layer is disposed to reach further out toward the edge than the fourth layer so that a second surface of the second layer is exposed for contact.

23. Wall element according to claim 15, wherein the layers are secured to each other by gluing.

24. Wall element according to claim 15, wherein that the layers are secured to each other by mechanical means.

25. Wall element according to claim 15, wherein the total thickness of aluminum in the wall element is of the order of about 12 mm.

26. Wall element according to claim 15, wherein the total thickness of $\mu$-metal in the wall element is of the order of about 2 mm.

27. Wall element according to claim 15, wherein the wall element has the shape of a planar rectangle.

28. Wall element according to claim 15, wherein the wall element is a corner element having a bend angle of 90°.

29. Room according to claim 15, wherein the room comprises at least one shell formed of said wall elements.

30. Room according to claim 15, wherein the room comprises two or more nested shells formed of said wall elements.

31. Room according to claim 15, wherein the room comprises connecting means for connecting each two adjacent wall elements together, said connecting means being arranged to provide a continuous electrical and magnetic conductivity between the adjacent wall elements.

32. Room according to claim 31, wherein the connecting means comprise a pair of beams to be connected with bolts for clamping the seam area from opposite sides of the wall elements.

33. Room according to claim 31, wherein a beam placed on the outer side of the room, being made of electrically conductive material and set in contact with the fourth layers of the adjacent wall elements, provides for electrical conductivity between said fourth layers.

34. Room according to claim 15, wherein the connecting means comprise a cover strip to be placed on the seam area between the two adjacent wall elements, said cover strip comprising a sixth layer which is formed of a material having a high electrical conductivity, such as aluminum, and a seventh layer which is formed of a material having a high permeability, such as μ-metal, said seventh layer being superimposed on top of the sixth layer and said seventh layer being wider than the sixth layer so that the seventh layer thus has an exposed third surface on either side of the sixth layer, whereby, when the cover strip is placed to cover the seam area, the sixth layer is in contact with the first surfaces of the first layers of the adjacent wall elements, thereby providing electrical conductivity over the seam, and the third surfaces of the seventh layer are in contact with the second layers andlor third layers of the adjacent wall elements, thereby providing magnetic conductivity over the seam.

35. Room according to claim 34, wherein the cover strip comprises an eighth layer, consisting of thin elastic material disposed between the sixth layer and the seventh layer.

36. Room according to claim 34, wherein the cover strip comprises a ninth layer, consisting of thin elastic material disposed on top of the seventh layer on the opposite side with respect to the sixth layer.

* * * * *